United States Patent [19]

Lupoli

[11] 4,413,234
[45] Nov. 1, 1983

[54] BATTERY-OPERATED CONDITION MONITOR

[75] Inventor: Peter J. Lupoli, Hamden, Conn.

[73] Assignee: Sun Chemical Corporation, New York, N.Y.

[21] Appl. No.: 306,282

[22] Filed: Sep. 28, 1981

[51] Int. Cl.³ .............................................. G01N 27/46
[52] U.S. Cl. ................................... 324/435; 340/636; 320/48
[58] Field of Search ................ 340/636; 320/48; 324/425, 427, 429, 433, 435

[56] References Cited

U.S. PATENT DOCUMENTS

| | | | |
|---|---|---|---|
| 2,225,051 | 10/1940 | Heyer | 324/435 |
| 3,939,421 | 2/1976 | Barringer | 340/636 |
| 3,974,441 | 8/1976 | Van Den Haak | 340/636 |
| 4,020,414 | 4/1977 | Paredes | 340/636 |
| 4,027,231 | 5/1977 | Lohrmann | 340/636 |
| 4,163,186 | 7/1979 | Haley | 340/636 |

OTHER PUBLICATIONS

Martin Bradley Weinstein et al., "Guard Your Battery With PM's Charge Checker," Popular Mechanics, vol. 151, No. 5, May 1979, pp. 84, 86, 264.

Primary Examiner—Michael J. Tokar
Attorney, Agent, or Firm—Cynthia Berlow

[57] ABSTRACT

A battery-condition tester for a vehicle having a storage battery and a charger connected with the battery. The tester comprises a pair of light-emitting indicators, one of which is intended to indicate a low battery condition and the other a normal battery condition. Current-control means are provided, connected with the indicators and with the battery, to selectively energize one or the other of the indicators in response to either a low or else a normal battery voltage condition. A third light-emitting indicator is intended to signal an over-voltage condition. Associated with the third indicator is an additional current control means, and voltage-responsive means connected with the battery for turning on the additional current control means, to energize the third indicator. Additionally, means are provided for positively turning off the first two indicator devices at such time that the third indicator is illuminated, so that for any condition of charge of the battery, only one of the indicator devices in on at any particular time.

11 Claims, 3 Drawing Figures

BATTERY-OPERATED CONDITION MONITOR

BACKGROUND

This invention relates generally to circuits for monitoring or testing the condition of a vehicle battery, and more particularly to circuits of the type employing one or more indicator lights which are intended to provide a visual indication of the condition of charge of the battery.

A number of such battery monitors have been proposed and produced over the years, and have met with moderate success. Many employed one or more incandescent bulbs which are arranged to become illuminated when either an over-voltage or other abnormal voltage condition occurred to the vehicle electrical system.

One such prior device is illustrated in U.S. Pat. No. 2,991,413 dated July 4, 1961. This patented construction employed multiple incandescent lamps or bulbs which become progressively illuminated to indicate the condition of the battery at any particular time. In one embodiment, three bulbs were provided, indicating low, medium and high voltage conditions. Referring to FIG. 1 in this patent, under low output conditions only the one bulb was illuminated. If the battery voltages reaches higher values, both the low and medium bulbs would be illuminated, and in the event that a high voltage condition occurred, all three bulbs would be lighted.

In another embodiment shown in FIG. 4 of the patent, additional circuitry was provided, involving the addition of two extra relays, such that when the bulb which indicated the high voltage condition was illuminated, both of the other bulbs were kept deenergized. Similarly, for a battery condition corresponding to a medium voltage, only the one bulb (55) was illuminated. The arrangement with the additional circuitry provided that only one lamp would be illuminated at any particular time.

While the above device operated more or less in a satisfactory manner, it can be readily appreciated that it was costly to produce, and also represented a solution of questionable reliability. In the embodiment described immediately above, a total of five relays was involved, leading to possible problems with arcing of contacts, contact sticking and deterioration; moreover, slight variations in magnetic field between different coils of the same type caused difficulty. In addition, it was found that such relays were generally very expensive to manufacture. While it may have been possible to obtain satisfactory performance of such a unit under ideal test conditions such as those which are found in a laboratory, the problems associated with mass-producing such items were considerable. In particular, there were variations in the physical and electrical characteristics of the coils associated with the relays, as well as variations in the springiness of the contacts. Such variations often led to erratic or unreliable operation, particularly over extended periods of use, or under adverse conditions as were typically found in the automobile environment. It can be readily appreciated that the equipment located in an automobile engine compartment is subjected to temperature extremes from well below 0° F., to upwards of 250°–300° F. Accordingly, any sensitivity in the above circuit as far as temperature variations is concerned, would have deleterious effects on the operation and reliability of the device. Moreover, even under the best of circumstances, conventional relays are subject to failure when operated over an extended period of time, due to deterioration of the contacts associated therewith. Such deterioration can be the result of either arcing, or else normal oxidation which inevitably occurs, unless special steps are taken to prevent these occurrences. Such steps may be in the nature of gold plated contacts, etc., which tend to resist oxidation. However, even with gold contacts, arcing is frequently a problem.

Another arrangement is illustrated and described in U.S. Pat. No. 4,027,231 dated May 31, 1977. The circuit shown therein involved a Zener reference diode, and three current-amplifier transistors which are connected respectively to light-emitting diodes. This particular patented circuit operated in such a way as to indicate the percentage of useful battery life remaining, by providing for illumination of one, two or all three light-emitting diodes. However, no provision was made for selectively energizing the light-emitting diodes to indicate either a low, normal, or else a high battery-voltage condition. Accordingly, there was the possibility of confusion arising unless the user who was employing the device understood its operation, and could make a somewhat subjective determination as to what the successive stages of illumination meant.

Still another arrangement is disclosed in U.S. Pat. No. 3,810,144 dated May 7, 1974. This battery monitor was in the form of a relatively simple circuit, employing one Zener diode and two transistors, as well as in incandescent bulb. In the particular unit illustrated, one transistor was normally on, with the second being normally off. When a drop in battery voltage occurred, falling below a pre-set value, the transistor switched their respective states, thus energizing the indicator light and providing an indication that low battery voltage was being experienced.

Yet another construction is illustrated in U.S. Pat. No. 1,338,170, wherein there is disclosed a circuit for monitoring the condition of the individual cells in a three-cell battery. Use is made of three incandescent bulbs, and the arrangement is such that when one particular cell fails, the one bulb corresponding to that cell will become extinguished. Accordingly, an indication as to the condition of each of the particular cells can thus be readily obtained.

U.S. Pat. No. 4,025,916 dated May 24, 1977 relates to a rather involved circuit for determining the condition of a battery. In particular, the battery is subjected to a load, and thereafter the drop in voltage which occurs after a pre-determined time interval has elapsed, is employed to indicate the condition of the battery. The battery voltage, following the elapsed time and with the battery under load, is compared to a reference voltage, and the difference is used to gate one of three indicator circuits corresponding to either adequate, marginal, or else poor output voltage. Presumably this circuit operated in an acceptable manner, but as can be readily determined from a perusal of the drawings, the circuitry involved was quite complicated. Under such circumstances, it is believed that such a circuit would be relatively expensive to manufacture and build.

Yet another monitor arrangement is illustrated in U.S. Pat. No. 4,247,813. FIG. 4 of this patent shows a two-terminal circuit which is intended to be connected to the battery being monitored, the circuit having a light-emitting diode and being arranged in such a manner that the diode becomes illuminated when either a high battery voltage or else a low battery voltage is sensed. With the circuit of FIG. 4, it could not be determined whether the abnormality was on the high side or the low side. An alternate arrangement is illustrated in FIG. 5 of the patent, wherein there are provided two light-emitting diodes, one of which is intended to be illuminated under conditions of high battery voltage and the other illuminated under conditions of low battery voltage.

While the above circuits operated in a somewhat satisfactory manner, several disadvantages became apparent. One or two of the circuits disclosed in the above patents were rather complex, and thus tended to be expensive to manufacture and produce. In addition, in U.S. Pat. No. 1,338,170 wherein the condition of each of the battery cells is monitored, it is necessary to make special connections to each cell. In the present day automotive industry such connections would be considered much too cumbersome to be of a practical value, and accordingly this circuit would not be suitable for use in today's vehicles.

In still others of the patents, it is often not clear whether the abnormality that is being sensed represents either a high voltage or a low voltage. In addition, in the absence of emitted light coming from a device having a single bulb, it is not clear to the operator if a normal battery condition was being monitored with the light merely being off, or if there existed the possibility of a malfunction in the circuit (such as a burned out bulb), in which case the device would not be operative. Such arrangements are generally to be avoided if at all possible, since an inoperative circuit which does not provide an indication of this condition can give the user a false sense of security.

In the above patent that involves multiple relays (five), the complexity of the device is too great to make its use practical in a modern vehicle. It can be readily appreciated that where hundreds of thousands of automobiles are manufactured every year, cost reduction is considered to be very important from the manufacturer's standpoint. This is true to such an extent that even reductions on the order of one cent or less are often considered to be worthwhile, as far as a particular system or component of an automobile is concerned. It must be realized, too, that many of the improvements that are introduced in a current model year will be carried over to future years, and may appear in manufacturing runs over periods of five or ten years, or more.

SUMMARY

The above disadvantages and drawbacks of prior battery-condition monitor devices are obviated by the present invention, which has for one object the provision of a novel and improved condition monitor device which is extremely simple in its construction, while at the same time providing a reliable and foolproof indication to the user of the condition of the battery at all times.

A related object of the invention is to provide an improved battery condition monitor as above set forth, wherein at least one of the indicator devices is illuminated at all times, so as to provide the user with an indication that the monitor is properly connected, and also that it is functioning in a normal manner.

Still another object of the invention is to provide an improved battery-condition monitor as above characterized, which can be readily connected to existing electrical systems of a vehicle without the need for extra leads, or special connections of an unusual nature.

Yet another object of the invention is to provide an improved battery condition monitor of the kind indicated, which is stable in its operation over a particularly wide temperature range, so that the unit is well adapted to use in the relatively harsh environment associated with the automobile.

A still further objective of the invention is to provide an improved battery-condition monitor as outlined above, wherein three visual indicators are provided, and wherein only one of the three indicators is illuminated at any one time, corresponding to either a low-voltage condition, a normal voltage condition, or else a high-voltage condition of the vehicle battery and electrical system, with the entire circuit being substantially completely solid state, including the indicators as well, which latter can be in the form of light-emitting diodes. Such arrangement is important from the standpoint of reliability and freedom from malfunction over extended periods of use. The above advantages are not had by the devices of the prior art, which involve the use of either incandescent bulbs that are subject to burn out, or else devices such as relays involving coils that can burn out, and which have movable contacts that are subject to breakage, and/or deterioration from oxidation, arcing etc. The inherent reliability of all solid-state circuitry characterizes the present construction.

The above objects are accomplished by a battery-condition tester for a vehicle having a storage battery and a charger connected with the storage battery, wherein a pair of light-emitting indicators is connected in circuit with one side of the battery, and current-control means are connected respectively to control the said indicators and in circuit with the other side of the battery. Voltage-responsive means are provided, connected in circuit with both sides of the battery, for controlling the current control means so as to selectively energize one or the other of the indicators in response to a low battery voltage or else a normal battery voltage. A third light-emitting indicator is connected in circuit with one side of the battery, with over-voltage current-control means being connected to control the third indicator and in circuit with the other side of the battery. An additional voltage-responsive means is connected in circuit with both sides of the battery, for turning on the over-voltage current-control means to energize the third indicator in response to an over-voltage of the battery. Finally, there are provided means controlled by the over-voltage current-control means, for turning off the first-mentioned current-control means to extinguish the pair of light-emitting indicators when the over-voltage current-control means is operative to energize the third indicator.

The arrangement is such that at least one indicator is illuminated at all times, so that an indication of the operativeness of the device is provided to the user. In addition, because only one of the indicators is fully illuminated at any particular time, the likelihood of confusion arising with the user interpreting properly the meanings of the readings is greatly reduced or eliminated.

The entire unit can be made substantially completely solid state, whereby the device is of physically small size, is especially reliable, and draws very little current. Moreover, it can be supplied on the vehicle as either an add-on accessory or else as original equipment.

Other features and advantages will hereinafter appear.

In the drawings, illustrating a preferred embodiment of the invention:

Figure 1:
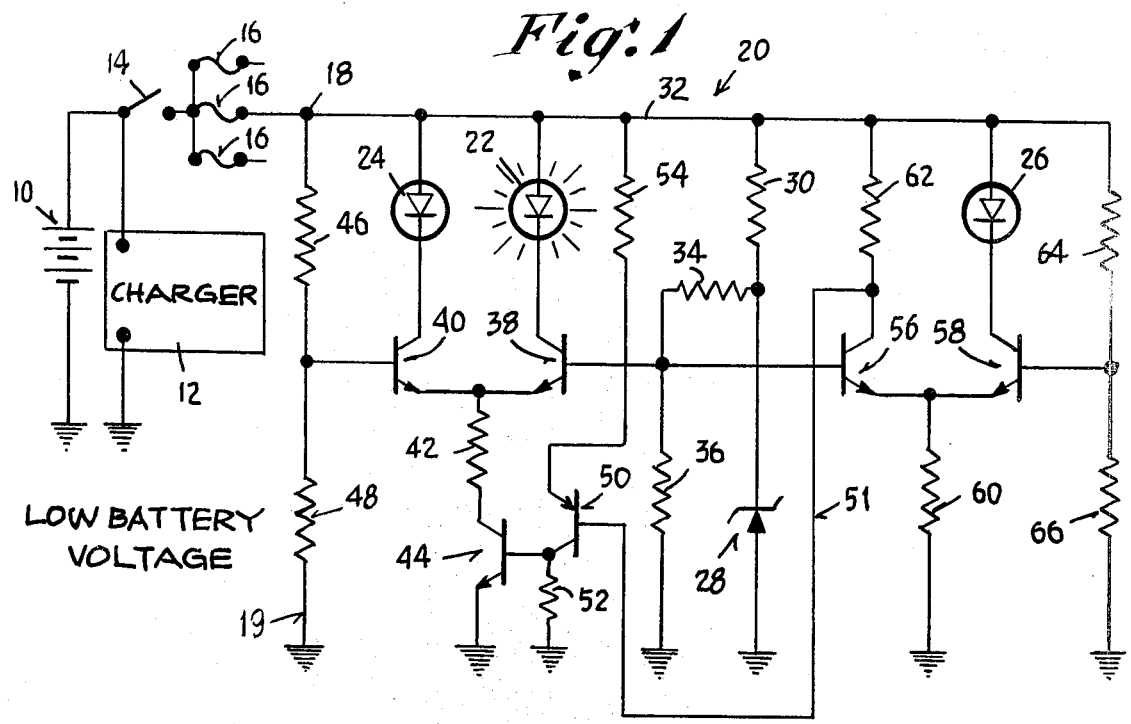
FIG. 1 is a schematic circuit diagram of the improved battery-condition tester of the present invention, shown with one indicator being illuminated, corresponding to a low battery voltage condition.

Referring first to FIG. 1, there is illustrated a storage battery for a vehicle, the battery being generally designated by the numeral 10 and being connected to the vehicle charger 12 in the normal manner, and also to the vehicle ignition switch 14. Multiple fuses 16 are provided, the outer two of which extend conventionally to various parts of the vehicle electrical system, and the center of which is shown as being connected to one of a pair of terminals 18, 19, the latter being the vehicle ground or chassis.

In accordance with the present invention there is provided a novel circuit comprising three light-emitting indicators which are intended to be selectively energized according to the magnitude of the battery and electrical system output voltage, to thus give an indication of normal, low or else high output voltage. The monitor circuit is generally designated by the numeral 20, with the indicators being designated by the numerals 22, 24 and 26.

A steady reference voltage is established in the unit by means of a Zener diode 28, which is connected through a biasing resistor 30 to the positive supply line 32 that extends to the battery. A voltage divider consisting of resistors 34 and 36 establishes a fixed voltage on the base of one transistor 38 of a differential amplifier, the other transistor being indicated by the numeral 40. As shown, the emitters of the transistors 38 and 40 are connected together, and extend through a limiting resistor 42 to the collector of a switching transistor 44. The emitter of the transistor 44 is grounded as shown. The indicators 22 and 24 are in the form of light-emitting diodes, and are shown as being disposed at the collectors of the transistors 38, 40, respectively. Transistor 40 receives base voltage from a voltage responsive means in the form of a voltage divider consisting of resistors 46, 48, these latter two resistors providing a voltage on the base of transistor 40 which is indicative of the output voltage of the battery 10. This voltage (on the base of transistor 40) is compared to the voltage on the base of transistor 38, derived from the Zener diode 28, to produce an indication of the magnitude of the battery voltage, as by illumination of the respective indicator 22 or 24, as will be explained below.

Referring again to FIG. 1, the base of transistor 44 is connected to the collector of an inverter transistor 50, and a biasing resistor 52 extends to ground. The emitter of the transistor 50 is connected to a load resistor 54 which extends to the line 32. The base extends via a control line 51, to the collector of a transistor 56, described below.

Also provided by the invention is a second differential amplifier comprising transistors 56, 58, having their emitters connected together, with a resistor 60 extending to ground. A load resistor 62 is connected between the collector of the transistor 56 and the supply line 32, and the additional or third indicator in the form of a light-emitting diode 26 is connected from the collector of the transistor 58 to the line 32. An additional voltage responsive means in the form of a voltage divider network consisting of resistors 64 and 66 divides the battery voltage, for application to the base of the transistor 58.

I have found that the following component types and values provide satisfactory results in the circuit that is disclosed in the figures and described above:

|  | Zener 28 | 6.2 volts |
| --- | --- | --- |
| Transistor 38 | 2N3903 |  |
| Transistor 40 | 2N3903 |  |
| Transistor 44 | 2N3903 |  |
| Transistor 50 | 2N3905 |  |
| Transistor 56 | 2N3903 |  |
| Transistor 58 | 2N3903 |  |
| Resistor 46 | 10,000 ohms |  |
| Resistor 48 | 3,300 ohms |  |
| Resistor 42 | 330 ohms |  |
| Resistor 52 | 100 ohms |  |
| Resistor 54 | 470 ohms |  |
| Resistor 34 | 10,000 ohms |  |
| Resistor 36 | 10,000 ohms |  |
| Resistor 30 | 470 ohms |  |
| Resistor 62 | 1,000 ohms |  |
| Resistor 60 | 330 ohms |  |
| Resistor 64 | 4,700 ohms |  |
| Resistor 66 | 1,000 ohms |  |

The light-emitting diode 22 is preferably yellow (indicating low battery voltage), with diode 24 being green (normal battery voltage) and diode 26 being red (high battery voltage).

The above values are given as examples only, and are not to be considered limiting. Deviations from the above values could be made, while still yielding good results.

Figure 2:
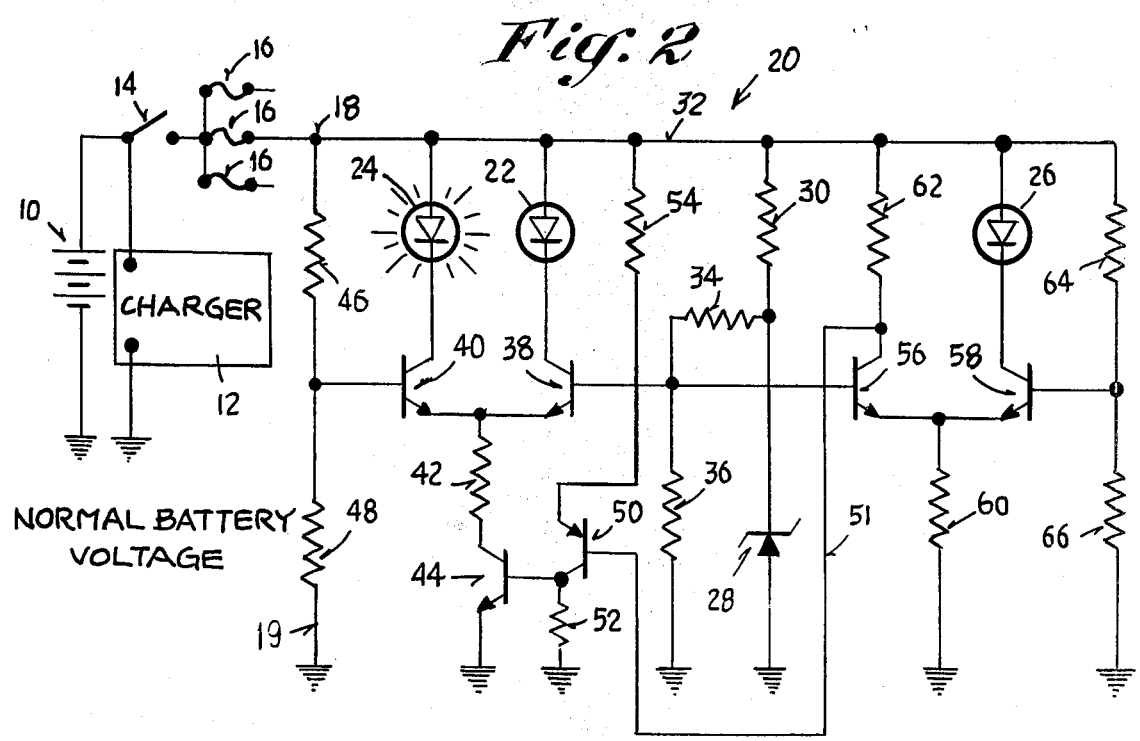
FIG. 2 is a schematic circuit diagram similar to FIG. 1, except with a second one of the indicators being illuminated, corresponding to a normal battery voltage condition.

The operation of the improved battery-condition monitor of the present invention can now be readily understood by referring to the figures. FIG. 2 shows the condition wherein the battery voltage would lie within a normal range, and thus the green light-emitting diode 24 would be illuminated.

In operation, under all circumstances, the transistor 38 receives a constant base voltage derived from the Zener diode 28. This base voltage is compared with the voltage on the base of transistor 40, which is derived from the voltage divider consisting of resistors 46, 48 and obtained from the output of the battery. Under normal circumstances, the voltage on the base of the transistor 40 exceeds that on the base of the transistor 38, wherein transistor 40 will be on, causing current to flow through the green light-emitting diode 24. The transistor 38 will be off or else less conductive, and thus the yellow light-emitting diode 22 will be extinguished. Transistors 44 and 50 are both fully on. It should be pointed out that under normal battery voltage, transistor 56 is on, and transistor 58 is off. Thus, the base of transistor 50 will be at a voltage lower than that of the emitter, and current will flow through the emitter of transistor 50 and its collector, and into the base of the transistor 44, in order to render it conductive. The reason that the transistor 56 is on and the transistor 58 is off, is that the magnitude of the voltage appearing on the base of the transistor 56 is higher than that obtained from the voltage divider 64, 66 and applied to the base of the transistor 58; so that in addition to the transistor 50 being on, the transistor 58 is off, thus reducing the current through the indicator 26 to near zero. Accordingly, with a normal voltage coming from the battery 10, the green light-emitting diode 24 will be on and the yellow and red light-emitting diodes 22 and 26 respectively will be off. This condition is indicated in FIG. 2.

Referring now to FIG. 1, if the output from the battery 10 should fall below a certain value for any reason, the decrease is sensed by the divider string consisting of resistors 46 and 48, such a decrease in turn being applied to the base of the transistor 40 and causing it to turn off. This extinguishes the green light-emitting diode 24. At the same time, the decrease in current flowing from the transistor 40 results in an increase in current through the transistor 38. With transistor 38 conducting, the yellow light-emitting diode 22 will now become illuminated, thus indicating that a low battery output voltage is being sensed. It is noted that the voltage on the base of transistor 38 has not changed from its previous value, since it was derived from the Zener diode 28. As far as the transistors 56 and 58 are concerned, with the decrease in battery output voltage the transistor 58 remains in an off condition, thus not energizing the red light-emitting diode 26. Transistor 56 remains on, even though its collector voltage may have dropped slightly, which keeps the transistors 50 and 44 in conductive states. Accordingly, with low battery voltage, the yellow light-emitting diode 22 is illuminated, with the green light-emitting diode 24 and red light-emitting diode 26 being out.

Figure 3:
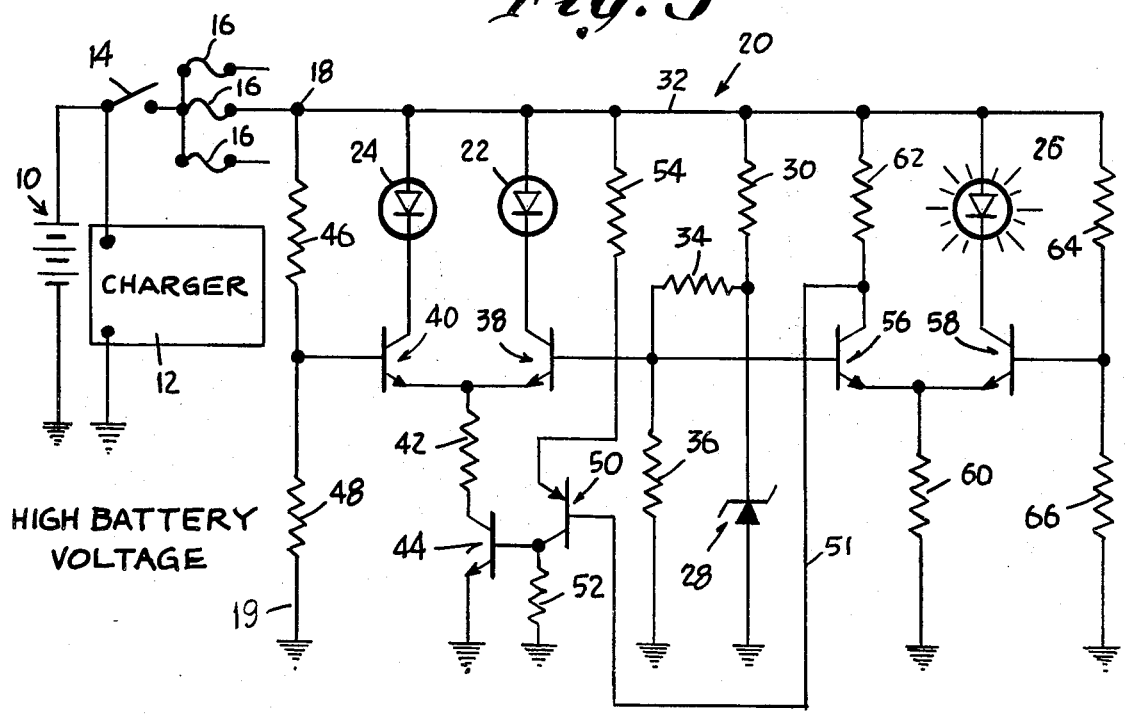
FIG. 3 is a schematic circuit diagram similar to FIG. 1, showing a third indicator as being illuminated, which would correspond to a high voltage condition of the battery and vehicle electrical system.

Referring now to FIG. 3, which depicts an over-voltage condition that would result from either an overcharged battery, or from an abnormally high charge condition from the battery charger 12, the following occurs: With the base of transistor 56 still receiving a constant voltage derived from the Zener 28, the increased battery voltage would be applied, through resistors 46 and 48, to the base of transistor 40, which would tend to turn this transistor on. However, at the same time, the increased voltage from the battery is sensed by the divider string comprising resistors 64 and 66. This increase in voltage is sufficient to turn transistor 58 on, thus causing the red light-emitting diode 26 to become illuminated. The increase in current through transistor 58 is accompanied by a decrease in current through the transistor 56, tending to turn the latter off. This in turn shuts off the transistor 50, and the transistor 44 as well. As a result, no current can flow through the resistor 42, since the transistor 44 collector becomes essentially an open circuit. Accordingly, neither the yellow light-emitting diode 22 nor the green light-emitting diode 24 will be illuminated, but instead the red light-emitting diode 26 will, indicating that an over-voltage condition exists. By the above arrangement, the turning-on of the transistor 58 results in a turning-off of the transistor 56, which in turn clamps off both the transistor 50 and the transistor 44. In this way, both of the remaining two light-emitting diodes 22, 24 (yellow and green) are maintained in an off condition.

The above construction has the following advantages, resulting in reliable operation and long life expectancy: Because the entire circuit is solid state, there exist no relay contacts to deteriorate. In addition, under normal operation the light-emitting diodes 22, 24 and 26 are not subject to failure over extended periods of time, as would be the case were incandescent bulbs to be employed. The use of similar transistors for the units 38, 40 as well as the units 56, 58, results in a desirable balance, such that temperature fluctuations which result in an increase in the Beta, as well as changes in the base-emitter junction voltages with temperature, are effectively cancelled out. Through the use of differential amplifiers, such temperature variations have either a negligible or minimal effect on the proper operation of the circuit. The Zener diode 28 can be a standard unit, or else a temperature-controlled version, to provide additional temperature stability. I have found that in the operation of the present circuit, a standard, non-compensated unit seems to work adequately well.

The fact that at all times, at least one of the light-emitting diodes 22, 24 or 26 is on, there is provided to the user a positive indication that the circuit is: (1) connected to the battery, and (2) functioning properly. Such is not the case in some prior circuits having a single trouble light, wherein there existed the possibility that the circuit was not connected to the battery, or else that there was a malfunction in the circuit, or possibly a burned-out bulb.

As can be readily seen from an inspection of the three figures that are shown herein, there is involved a minimum number of parts. In particular, one Zener diode is required, constituting a stable reference voltage against which the battery voltage can be compared; two differential amplifiers, each comprising two transistors; and a switch comprising an additional two transistors.

With the circuit as shown, it will be noted that one lead of each of the three light-emitting diodes is connected in common to the hot side of the battery circuit, which is protected by one of the fuses 16. In the physical set up of the device, these three leads can be very conveniently connected to the hot side bus without the intermediary of resistors, whereby a simpler circuitry is established, which can reduce costs. Added safety is had by the fusing of the hot side bus of the circuit.

Accordingly, the present circuit can be very simply constructed, and represents a minimal manufacturing cost. This is extremely important in the case of modern automotive engineering wherein fractional costs are often considered to be critical.

The device is thus seen to represent a distinct advance and improvement in the technology of battery monitors.

Each and every one of the appended claims defines a distinct aspect of the invention separate from the others, and accordingly each is to be treated in this manner when examined in the light of the prior art, in any determination of novelty or validity.

Variations and modification are possible without departing from the spirit of the invention.

What is claimed is:

1. A battery-condition tester for a vehicle having a storage battery and a charger connected with the storage battery, comprising in combination:
   (a) a pair of light-emitting indicators connected in circuit with one side of the battery,
   (b) current-control means connected respectively to control said indicators and in circuit with the other side of the battery,
   (c) voltage-responsive means connected in circuit with both sides of the battery, for controlling said current control means to selectively energize one or the other of the indicators in response to a low battery voltage or else a normal battery voltage, (d) a third light-emitting indicator connected in circuit with one side of the battery, (e) over-voltage current-control means connected to control said third indicator and in circuit with the other side of the battery, (f) an additional voltage-responsive means connected in circuit with both sides of the battery, for turning on said over-voltage current-control means to energize said third indicator in response to an over-voltage of the battery, and (g) means controlled by said over-voltage current-control means, for turning off said first-mentioned current-control means to extinguish said pair of light-emitting indicators when the over-voltage current-control means is operative to energize the third indicator.

2. The invention as defined in claim 1, wherein:
(a) the current-controlled means comprises a differential amplifier, and
(b) a zener diode,
(c) one input of the differential amplifier being connected to sense output voltage received from said battery,
(d) the other input of the differential amplifier being connected to sense a substantially constant voltage derived from the zener diode.

3. The invention as defined in claim 2, wherein:
(a) the differential amplifiers comprise transistors,
(b) said light-emitting indicators being connected in the collector circuits of the transistors, respectively.

4. The invention as defined in claim 2, wherein:
(a) the differential amplifiers comprise transistors,
(b) said current control means further comprising an electronic switch connected to the transistors and operable to turn the same on and off.

5. The invention as defined in claim 1, wherein:
(a) the over-voltage current control means comprises a differential amplifier, and
(b) a zener diode,
(c) one input of the differential amplifier being connected to sense output voltage received from said battery,
(d) the other input of the differential amplifier being connected to receive a substantially constant voltage derived from the zener diode.

6. The invention as defined in claim 5, wherein:
(a) the differential amplifier comprises transistors,
(b) said third light-emitting indicator being connected in the collector circuit of one of the transistors.

7. The invention as defined in claim 1, wherein:
(a) the current-control means comprises a differential amplifier, and
(b) a switch connected to control current flow through the differential amplifier,
(c) said over-voltage current control means comprising a second differential amplifier,
(d) said turning-off means comprising a control line extending from the output of the second differential amplifier to said switch, so as to reduce current flow through the first differential amplifier when a signal of predetermined magnitude is received from the second differential amplifier.

8. The invention as defined in claim 7, wherein:
(a) the third light-emitting indicator is connected to one output of the second differential amplifier, and
(b) the said control line being connected to the other output of the second differential amplifier.

9. The invention as defined in claim 7, wherein:
(a) said switch comprises an NPN transistor having its collector connected to receive current from the first differential amplifier, and
(b) an inverter transistor connected to drive said NPN transistor, said inverter transistor being connected to receive signals from said control line.

10. The invention as defined in claim 1, wherein:
(a) said pair of indicators and said third indicator all have a common power lead receiving energy from one side of the battery, and
(b) dropping resistors through which the indicators receive energy, connected with the other side of the battery,
(c) said resistors comprising parts of said current control means.

11. The invention as defined in claim 10, and further including:
(a) a fuse interposed in said common power lead, to safeguard against short-circuits occurring therein.

* * * * *